(12) United States Patent
Igata et al.

(10) Patent No.: US 9,919,384 B2
(45) Date of Patent: Mar. 20, 2018

(54) LIGHT EMITTING DEVICE AND METHOD OF PRODUCING THE LIGHT EMITTING DEVICE

(71) Applicant: NICHIA CORPORATION, Anan-shi, Tokushima (JP)

(72) Inventors: Toshiya Igata, Tokushima (JP); Hirofumi Yoshida, Tokushima (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 14/740,321

(22) Filed: Jun. 16, 2015

(65) Prior Publication Data
US 2015/0362158 A1   Dec. 17, 2015

(30) Foreign Application Priority Data
Jun. 17, 2014   (JP) .................. 2014-124511

(51) Int. Cl.
| | |
|---|---|
| *F21V 15/00* | (2015.01) |
| *B23K 35/30* | (2006.01) |
| *B23K 1/00* | (2006.01) |
| *H01L 33/48* | (2010.01) |
| *H01L 33/58* | (2010.01) |

(Continued)

(52) U.S. Cl.
CPC ........ *B23K 35/3013* (2013.01); *B23K 1/0016* (2013.01); *B23K 35/0222* (2013.01); *B23K 35/0255* (2013.01); *B23K 35/26* (2013.01); *B23K 35/262* (2013.01); *B23K 35/30* (2013.01); *B23K 35/3613* (2013.01); *H01L 33/486* (2013.01); *H01L 33/58* (2013.01); *B23K 2201/42* (2013.01); *B23K 2203/02* (2013.01); *B23K 2203/08* (2013.01); *B23K 2203/12* (2013.01); *B23K 2203/18* (2013.01); *B23K 2203/42* (2015.10); *B23K 2203/52* (2015.10); *H01L 2224/48091* (2013.01); *H01L 2224/73265* (2013.01); *H01L 2924/16195* (2013.01); *H01L 2933/0033* (2013.01); *H01L 2933/0058* (2013.01)

(58) Field of Classification Search
CPC ...... F21V 17/104; F21V 23/002; F21V 23/06; F21V 15/01; H01L 2933/0033; H01L 2933/0058; F21Y 2115/10; F21K 9/00
See application file for complete search history.

(56) References Cited

U.S. PATENT DOCUMENTS

| | | | | |
|---|---|---|---|---|
| 6,639,356 B2* | 10/2003 | Chin | ............... | H01L 33/642 |
| | | | | 313/498 |
| 8,421,088 B2* | 4/2013 | Konishi | ................ | H01L 33/60 |
| | | | | 257/100 |

(Continued)

FOREIGN PATENT DOCUMENTS

| | | | | |
|---|---|---|---|---|
| CN | 201007435 | * | 1/2008 | ........... F21S 2/00 |
| JP | 2007-042679 A | | 2/2007 | |

(Continued)

*Primary Examiner* — Peggy Neils
(74) *Attorney, Agent, or Firm* — Squire Patton Boggs (US) LLP

(57) ABSTRACT

A light emitting device includes a package having a recess, a light emitting element disposed in the recess, a light-transmissive member covering an opening of the recess, and a frame member bonded to the package. The light-transmissive member is held by and between the package and the frame member.

17 Claims, 8 Drawing Sheets

(51) Int. Cl.
*B23K 35/26* (2006.01)
*B23K 35/36* (2006.01)
*B23K 35/02* (2006.01)
B23K 101/42 (2006.01)
B23K 103/18 (2006.01)
B23K 103/00 (2006.01)
B23K 103/02 (2006.01)
B23K 103/08 (2006.01)
B23K 103/12 (2006.01)

(56) References Cited

U.S. PATENT DOCUMENTS

| 8,841,690 B1* | 9/2014 | Kim | H01L 33/483 |
| | | | 257/100 |
| 8,894,251 B2* | 11/2014 | Yokotani | F21V 9/16 |
| | | | 257/98 |
| 9,028,086 B2* | 5/2015 | Woo | F21V 7/04 |
| | | | 362/294 |
| 2008/0266869 A1* | 10/2008 | Tai | H01L 33/486 |
| | | | 362/294 |
| 2015/0369469 A1* | 12/2015 | Vamberi | F21S 8/022 |
| | | | 362/153.1 |

FOREIGN PATENT DOCUMENTS

| JP | 2007-180066 A | 7/2007 | |
| JP | 2009-087681 A | 4/2009 | |
| JP | 2011-014769 A | 1/2011 | |
| JP | 2013-074274 A | 4/2013 | |
| JP | 2013-115351 A | 6/2013 | |
| KR | 1020100076625 | * 7/2010 | ............. F21V 31/00 |
| WO | WO 2012/053386 A1 | 4/2012 | |

* cited by examiner

LIGHT EMITTING DEVICE AND METHOD OF PRODUCING THE LIGHT EMITTING DEVICE

CROSS-REFERENCE TO RELATED APPLICATION

This application claims priority to Japanese Patent Application No. 2014-124511, filed on Jun. 17, 2014. The entire disclosure of Japanese Patent Application No. 2014-124511 is hereby incorporated herein by reference.

BACKGROUND OF THE INVENTION

1. Field of the Invention

The embodiments of the present disclosure relate to a light emitting device and a method of producing the light emitting device.

2. Description of Related Art

Light emitting diodes (LEDs) have many advantageous features such as low power consumption, long life, and high reliability. With a white color LED implemented by a combination of a blue color LED and phosphor that has been made into practical use, the LEDs are adapted to a wide variety of applications such as illumination of various types, light sources for backlighting and the like.

The light emitting device which employs such as LEDs may have a structure as disclosed in JP 2011-14769 A for example. The light emitting device disclosed in JP 2011-14769 A includes a package made of ceramic and the like and provided with a recess, a light emitting element disposed in the recess, and a light-transmissive member made of a glass or the like to cover an opening of the recess, and the opening of the package is sealed by the light-transmissive member.

In the light emitting device disclosed in JP 2011-14769 A, the light-transmissive member is generally bonded to the package. Accordingly, a crack may occur in the light-transmissive member due to a difference in coefficient of thermal expansion between the light-transmissive member and the package.

SUMMARY OF THE INVENTION

Therefore, an object of the embodiments of the present invention is to provide a light emitting device in which such a light-transmissive member can be reliably supported while preventing occurrence of cracks, and a method of producing the same.

In order to achieve the object, a light emitting device according to an embodiment of the present invention includes a package defining a recess, a light emitting element disposed in the recess a light-transmissive member covering an opening of the recess, and a frame member bonded to the package, in which the light-transmissive member is held by and between the package and the frame member.

A method of producing a light emitting device includes disposing a light emitting element in a recess of a package, covering an opening of the recess with a light-transmissive member and bonding a frame member to the package such that the light-transmissive member is held by and between the package and the frame member.

According to a light emitting device and a method of producing the light emitting device according to an embodiment of the present invention, the light-transmissive member is held by and between the package and the frame member which is bonded to the package, so that the light-transmissive member can be securely held and occurrence of a crack in the light-transmissive member can be prevented.

DETAILED DESCRIPTION OF EMBODIMENTS

In the following, embodiments of the present invention will be described with reference to the drawings.

Figure 1A:
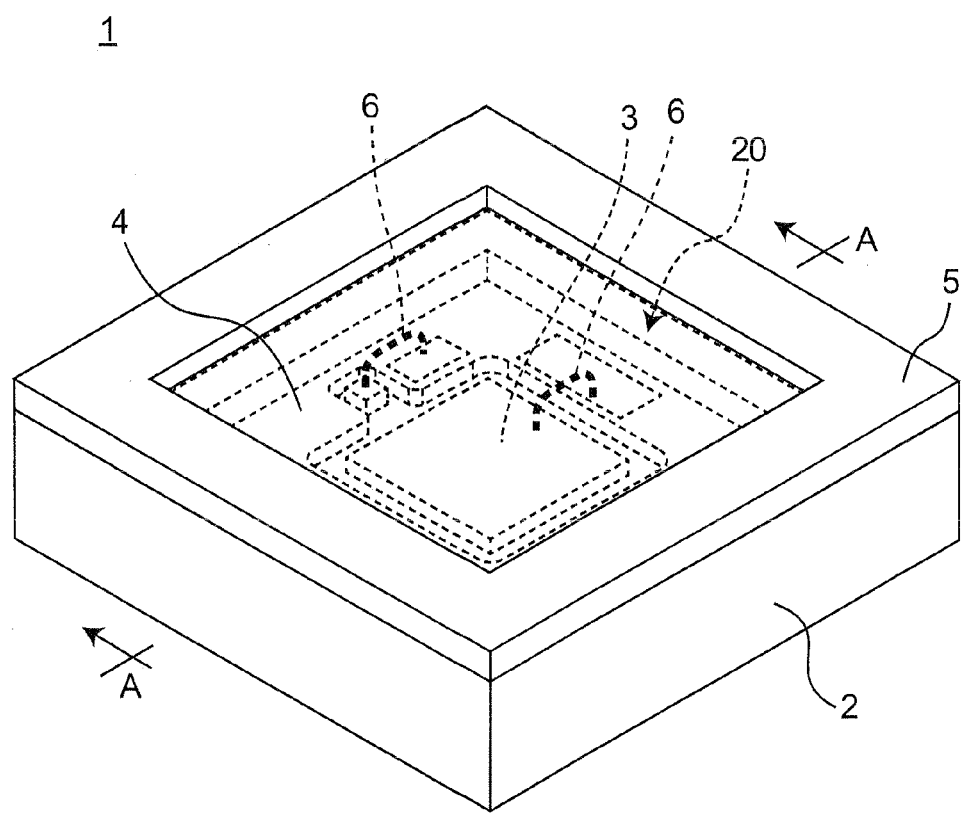
FIG. 1A is a perspective view showing a light emitting device according to an embodiment of the present invention.
Figure 1B:
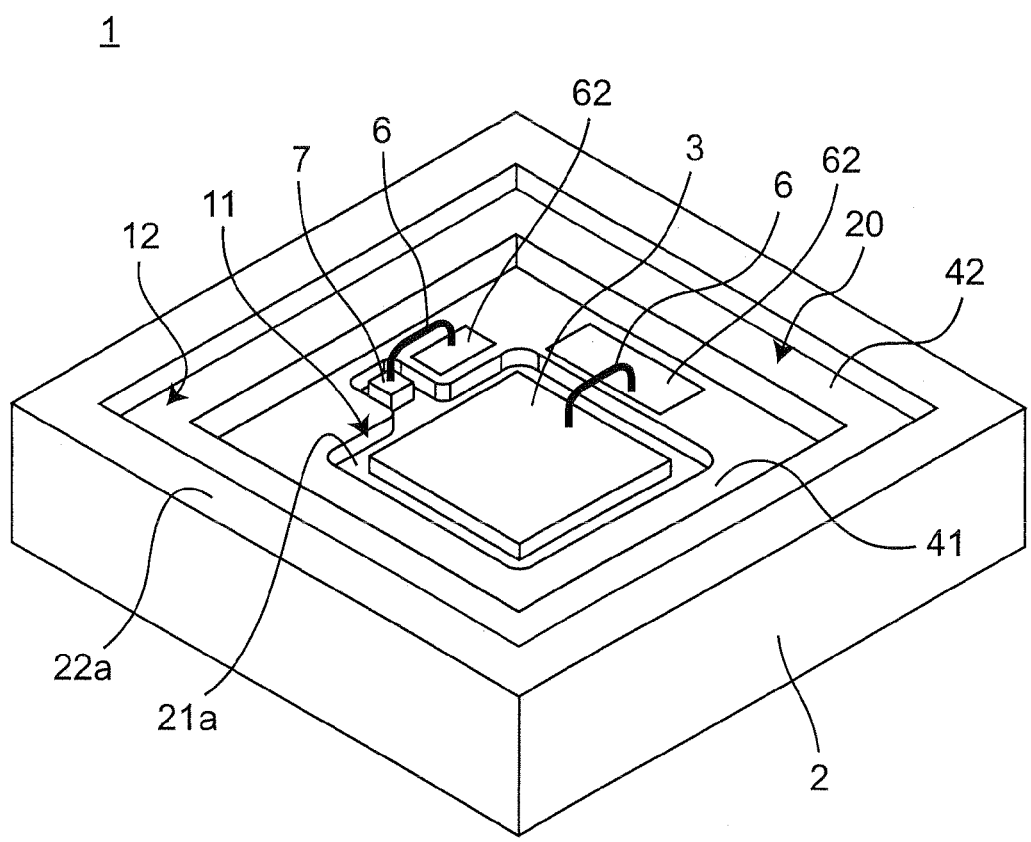
FIG. 1B is a perspective view showing a state in which a light-transmissive member and a frame member of the light emitting device shown in FIG. 1A are removed.
Figure 2:
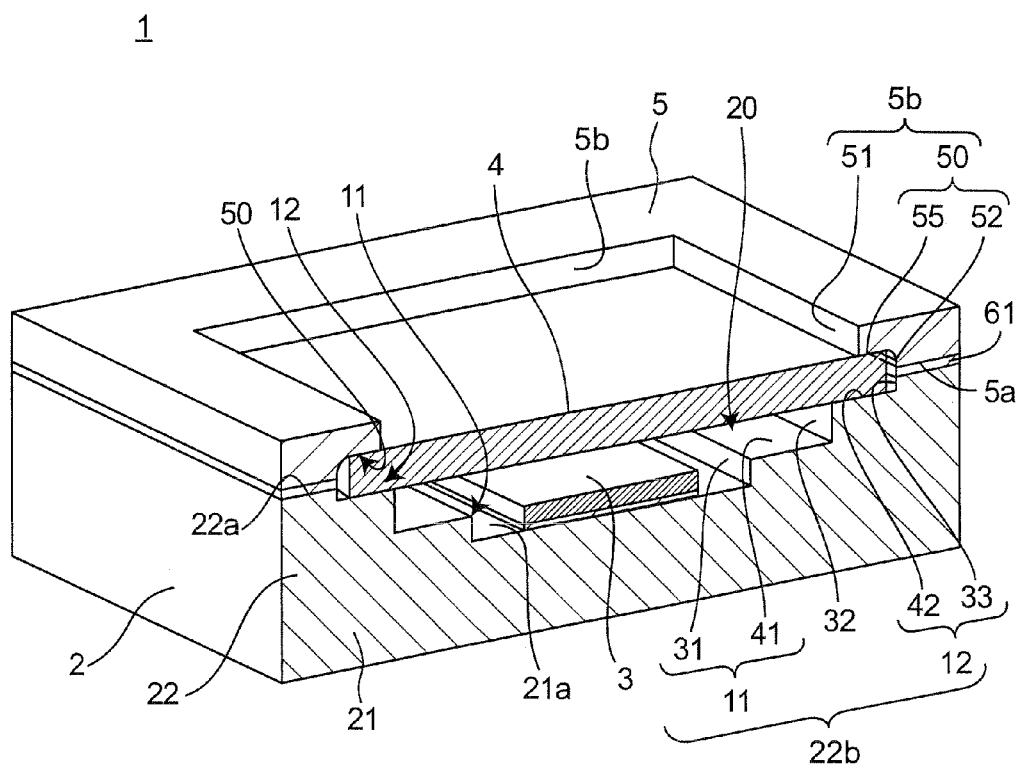
FIG. 2 is a perspective cross-sectional view of a light emitting device according to an embodiment of the present invention.
Figure 3:
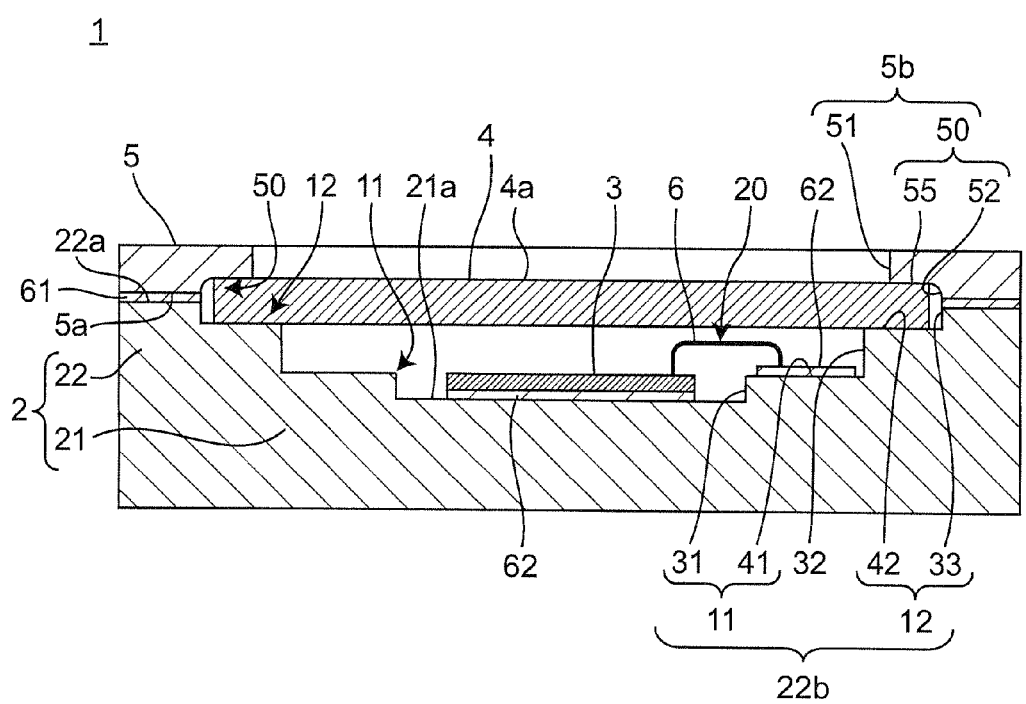
FIG. 3 is a schematic cross-sectional view of a light emitting device according to an embodiment of the present invention, taken along A-A of FIG. 1A.

FIG. 1A is a perspective view showing a light emitting device 1 according to an embodiment of the present invention. FIG. 1B is a perspective view showing a state where a light-transmissive member 4 and a frame member 5 of the light emitting device 1 are removed. FIG. 2 is a perspective partial cross-sectional view of the light emitting device 1. FIG. 3 is a cross sectional view taken along line A-A of FIG. 1A.

The configuration of the light emitting device 1 according to the present embodiment is suitable mainly for a light emitting device in which secure adhesion between a package on which a light emitting element is placed and a light-transmissive member which seals the package is difficult to obtain, such as for example, a light emitting device for emitting ultraviolet light, in which a package made of ceramic or the like is sealed by glass. As shown in FIG. 1A to FIG. 3, this light emitting device 1 includes a package 2 defining a recess 20, a light emitting element 3 disposed in the recess 20, a light-transmissive member 4 covering an opening of the recess 20, and a frame member 5 bonded to the package 2. In the present embodiment, the term "to bond" means to adhesively connect members to each other. In the light emitting device 1, light emitted from the light emitting element 3 passes through the light-transmissive member 4 and is emitted to the outside. In the following, the description will be given regarding that the opening side of the recess 20 is the upper side and the bottom surface side of the recess 20 is the lower side.

In a plan view, the package 2 has a side recess 12 at a place inner than an upper surface 22a (i.e., on the recess 20 side). The frame member 5 is provided with a side recess 50 at a place inner than a lower surface 5a (i.e., on the recess 20 side) in a plan view. The upper surface 22a of the package 2 is bonded to the lower surface 5a of the frame member 5.

The light-transmissive member 4 is held by and between the package 2 and the frame member 5. More specifically, the light-transmissive member 4 is engaged with the side recess 12 of the package 2 and the side recess 50 of the frame member 5, and the upper surface 22a of the package 2 and the lower surface 5a of the frame member are bonded to each other to hold the light-transmissive member 4 therebetween. Thus, the light-transmissive member 4 seals the recess 20 of the package 2.

In the light emitting device 1 of the present embodiment, the light-transmissive member 4 is held by and between the package 2 and the frame member 5 which is bonded to the package 2. Thus, the light-transmissive member 4 can be securely held. Further, although the light-transmissive member 4 is held by and between the package 2 and the frame member 5, the light-transmissive member 4 and the package 2 are not bonded to each other, and the light-transmissive member 4 and the frame member 5 are not bonded to each other. Accordingly, it becomes possible to prevent occurrence of a crack in the light-transmissive member 4 due to a difference in coefficient of thermal expansion between the light-transmissive member 4 and the package 2 or the frame member 5. Further, with the configuration described above, the material of the light-transmissive member 4 can be selected regardless of its coefficient of thermal expansion, so that a material of high light transmittance such as quartz or sapphire, or glass such as borosilicate glass can be used for the light-transmissive member 4.

In the following, each of the constituent members of the light emitting device 1 according to the present embodiment will be described in detail.

(Package 2)

The package 2 is preferably made of a material such as ceramic which has heat resistance and appropriate mechanical strength. Examples of the materials of ceramic include oxides such as alumina, mullite, and forsterite, nitrides such as AlN, and carbides such as SiC. Examples of other materials of the package include metals such as aluminum, copper, copper tungsten, iron nickel alloy, and Kovar, inorganic materials such as silicon, and resin materials such as polyamide resin, polyphthalamide resin, and glass epoxy resin. In view of connection between the package 2 and the frame member 5, the package 2 is preferably made of a material which has a coefficient of thermal expansion similar to that of the frame member 5.

The package 2 has positive and negative interconnections 62 that are electrically connected to the electrodes of the light emitting element 3. The interconnections 62 are formed at least on the surface of the recess 20 of the package 2, and may be formed inside the package 2, on the lower surface, or on the side surface. Exemplary materials of the interconnections 62 include copper, nickel, palladium, tungsten, chromium, titanium, aluminum, silver, gold, and alloy thereof. The surface of the interconnections 62 may be coated by gold, silver, platinum, tin, copper, rhodium, or alloy thereof, or a silver oxide or an oxide of silver alloy. These interconnections 62 and coating can be provided by plating, vapor deposition, sputtering, printing, painting or the like.

The package 2 of the present embodiment has the recess 20. The recess 20 is structured by a bottom surface portion 21 and a sidewall portion 22. The bottom surface portion 21 has at least an upper surface 21a that serves as the bottom surface of the recess 20. The light emitting element 3 is disposed on the interconnection on the upper surface 21a of the bottom surface portion 21. Further, though a protective element 7 is disposed on the interconnection on the upper surface 21a of the bottom surface portion 21 in the present embodiment, the protective element 7 may be dispensed with. The sidewall portion 22 is integrally formed around the bottom surface portion 21, to have a substantially rectangular annular shape. The sidewall portion 22 has at least an upper surface 22a and an inner circumferential surface 22b. The recess 20 is formed by the upper surface 21a of the bottom surface portion 21 and the inner circumferential surface 22b of the sidewall portion 22.

The inner circumferential surface 22b of the sidewall portion 22 according to the present embodiment has, in order from the bottom side to the top side, a first inner surface 31 adjacent to the upper surface 21a of the bottom surface portion 21 substantially perpendicularly, a first stepped surface 41 adjacent to the first inner surface 31 outwardly substantially perpendicularly therefrom, a second inner surface 32 adjacent to the first stepped surface 41 substantially perpendicularly, a second stepped surface 42 adjacent to the second inner surface 32 outwardly substantially perpendicularly therefrom, and a third inner surface 33 adjacent to the second stepped surface 42 substantially perpendicularly and adjacent to the upper surface 22a of the sidewall portion 22. The first inner surface 31 and the first stepped surface 41 form a step difference 11, and the second stepped surface 42 and the third inner surface 33 form the side recess 12 for the light-transmissive member 4 to be disposed. The recess 20 is widened upward by the side recess 12.

On the step difference 11 (i.e., on the first stepped surface 41), the interconnection 62 may be formed. Thus, the wire bonding portion of the light emitting element 3 (and that of the protective element 7) can be formed on the first stepped surface 41. Then, the first inner surface 31 hinders the light from the light emitting element 3 disposed on the bottom surface of the recess 20 from illuminating the wire bonding portions. Accordingly, deterioration of the wire bonding portions can be suppressed, and trouble of the light emitting device 1 can be prevented. The side recess 12 of the present embodiment is formed along the entire circumference of the inner circumferential surface 22b of the sidewall portion 22 in a planar view (i.e., along the four sides of the inner circumferential surface 22b of the sidewall portion 22 having the substantially rectangular annular shape). In this manner, it is preferable that the side recess 12 for the light-transmissive member 4 to be disposed is formed along the entire circumference of the inner circumferential surface 22b of the sidewall portion 22, because the light-transmissive member 4 can be reliably fixed.

In the present embodiment, a configuration in which the package 2 has the step difference 11 and the side recess 12 is illustrated, the step difference 11 is preferably formed at a position lower than the side recess 12. Moreover, the step difference 11 is an optional, and with the side recess being provided in the frame member 5, the side recess in the package 2 is also an optional. The package 2 may have a plurality of step differences 11 and a plurality of side recesses 12. Further, in the present embodiment, the recess 20 is widened upward by the step difference 11 and the side recess 12, but the shape of the recess 20 is not limited thereto. The inner surfaces and the stepped surfaces of the inner circumferential surfaces 22b of the sidewall portion 22 are not necessarily substantially perpendicularly adjacent to each other, and the inner surface may have a tapered shape. The side recess 12 is not necessarily formed along the entire circumference of the inner circumferential surfaces 22b of the sidewall portion 22, and can be formed at opposite sides or only at corners as appropriate.

(Light Emitting Element 3)

The light emitting element 3 is disposed on the interconnection on the upper surface 21a (i.e., the bottom surface of the recess 20) of the bottom surface portion 21. Preferably, the light emitting element 3 is a semiconductor light emitting element configured to emit light of a predetermined wavelength. For example, the light emitting element 3 includes a substrate, a semiconductor layer formed on the substrate, and positive and negative electrodes connected to the interconnections 62 of the package 2. The semiconductor layer preferably includes at least a first semiconductor layer and a second semiconductor layer, and an active layer therebetween. As the semiconductor layer, a semiconductor such as AlGaN, ZnS, ZnSe, SiC, GaP, GaAlAs, AlN, InN, AlInGaP, InGaN, GaN, or AlInGaN is used, for example.

The positive and negative electrodes of the light emitting element 3 can be formed in a same-side electrode configuration in which the positive and negative electrodes are disposed on a same surface of the semiconductor layer, or may be formed into a counter electrode configuration in which the positive and negative electrodes are respectively disposed on opposite surfaces. In the present embodiment, the light emitting element 3 which has a counter electrode configuration is employed. One of the positive and negative electrodes and its corresponding interconnection 62 are connected to each other by an electrically conductive adhesive agent or the like, and the other electrode and its corresponding interconnection 62 are electrically connected to each other by a wire 6 (i.e., a face-up mounting). The light emitting element 3 may be mounted in a flip-chip configuration. The substrate of the light emitting element 3 may be removed. In such cases, for example, a configuration can be employed in which after the substrate is removed from the semiconductor layer, a different substrate is bonded to the semiconductor layer. The substrate can be removed by peeling, polishing, LLO (Laser Lift Off) or the like.

The emission peak wavelength of the light emitting element 3 may be, for example, about 200 nm to 50.0 nm. The number of the light emitting elements 3 to be arranged may either be one or a plural, which can be selected appropriately for realizing desired light emission. Further, the shape, size and the like of the light emitting element 3 are not also specifically limited.

(Light-Transmissive Member 4)

The light-transmissive member 4 is a member that transmits light. Preferably, for example, the light-transmissive member 4 is made of glass or the like, which little deteriorates. Other exemplary material of the light-transmissive member 4 may be resin such as epoxy resin, silicone resin, polyamide resin, polypropylene resin, acrylic resin, or polycarbonate resin, or quartz or the like. The light-transmissive member 4 is preferably transparent, but it may be opaque (e.g., cloudy). The light-transmissive member 4 may contain a phosphor, a coloring agent, a light diffusing agent, a filler or the like. With the use of the light-transmissive member 4 made of a material of small coefficient of thermal expansion, occurrence of cracking can be prevented at the time of bonding the package 2 and the frame member 5. Further, the light-transmissive member 4 is preferably made of a material which has a small difference in the coefficient of thermal expansion with respect to that of the package 2 and the frame member 5.

In the case where the peak wavelength of the light emitting element 3 is in the near ultraviolet to ultraviolet region, i.e., equal to or smaller than 400 nm, it is preferable to employ glass as the material of the light-transmissive member. Thus, deterioration can be prevented compared to the case where a resin-made light-transmissive member is employed. Further, in the case where the peak wavelength is in the deep ultraviolet region, i.e., equal to or smaller than 250 nm, it is preferable to employ quartz. Thus, light from the light emitting element 3 can be efficiently extracted.

In the present embodiment, in a plan view, the light-transmissive member 4 has a shape substantially similar to the opening of the recess 20 (i.e., a substantially rectangular plate-like shape). The light-transmissive member 4 is disposed in the side recess 12 of the package 2, and the frame member 5 is bonded from above. In detail, the periphery of the light-transmissive member 4 is fitted into the side recess 12 of the package 2 and the side recess 50 of the frame member 5 and fixed thereby. Thus, positional error of the light-transmissive member 4 can be reliably prevented. The shape of the light-transmissive member 4 is not particularly limited, as long as the light-transmissive member 4 can be held by and between the package 2 and the frame member 5. For example, other than a planar shape, the light-transmissive member 4 may have a convex lens-like shape, or may include a step difference or a groove.

(Frame Member 5)

The frame member 5 is a discrete member separate from the package 2, and made of a different material. For example, the frame member 5 is preferably made of a metal such as Kovar. The frame member 5 may be made of a metal other than Kovar (e.g., tungsten, iron nickel alloy, platinum, copper, or copper tungsten), an inorganic material (silicon or the like), a resin material (polyamide resin, polyphthalamide resin, glass epoxy resin or the like) or the like. Further, since the frame member 5 is bonded to the package 2, the frame member 5 is preferably made of a material which has a coefficient of thermal expansion similar to that of the package 2.

The frame member 5 is at least partially bonded to the package 2, and the light-transmissive member 4 is held between the frame member 5 and the package 2. The frame member 5 according to the present embodiment has a substantially rectangular annular shape similarly to the sidewall portion 22 of the package 2. The frame member 5 has the lower surface 5a and an inner circumferential surface 5b. As shown in FIG. 3, the inner circumferential surface 5b of the frame member 5 has, in order from the bottom side to the top side, a second inner surface 52 substantially perpendicularly adjacent to the lower surface 5a of the frame member 5, a stepped surface 55 extending inwardly substantially perpendicularly adjacent to the second inner surface 52, and a first inner surface 51 adjacent to the stepped surface 55 substantially perpendicularly. The second inner surface 52 and the stepped surface 55 of the frame member 5 defines the side recess 50. The space inside the inner circumferential surface 5b of the frame member 5 is widened downward by the side recess 50.

The side recess 50 of the frame member 5 according to the present embodiment is formed such that in a plan view along the entire circumference of the inner circumferential surface 5b of the frame member 5 (i.e., along the four sides of the inner circumferential surface 5b of the frame member 5 which has the substantially rectangular annular shape). This configuration is preferable that the side recess 50 to hold the light-transmissive member 4 is formed along the entire circumference of the inner circumferential surface 5b of the frame member 5, thus allowing the light-transmissive member 4 to be securely fixed.

The lower surface 5a of the frame member 5 according to the present embodiment is bonded to the upper surface 22a of the sidewall portion 22 of the package 2. Thus, the light-transmissive member 4 can be held by and between the package 2 and the frame member 5. The bonding portion of the frame member 5 and the package 2 may be provided along the entire circumference of the four sides of the frame member 5, or may be provided partially at the frame member 5, in a plan view. In this manner, by bonding the frame member 5 to the upper surface 22a of the package 2, they can be bonded easily and more stably than, for example, in the case of bonding the frame member 5 to the outer side surface of the package 2.

An adhesive agent 61 can be used for bonding the frame member 5 and the package 2. For example, with the package 2 made of a ceramic and the frame member 5 made of a metal, eutectic bonding can be employed by using a solder such as Au—Sn as the adhesive agent 61. In the case of using a solder as the adhesive agent 61, deterioration of the adhesive agent 61 due to the light from the light emitting element 3 can be more suppressed compared to the case where the adhesive agent 61 of resin or the like is used. In particular, in the case of using a light emitting element configured to emit strong energy such as ultraviolet light, it is more preferable to use a solder than a resin as the adhesive agent 61. Further, solder bonding makes it possible to correct positional error between the package 2 and the frame member 5 by self-alignment effect of the solder. In place of eutectic bonding, the frame member 5 and the package 2 can be bonded to each other by welding, bonding through the use of low-melting glass or resin (e.g., epoxy resin, silicone resin or the like), Au—In bonding or the like.

Figure 4:
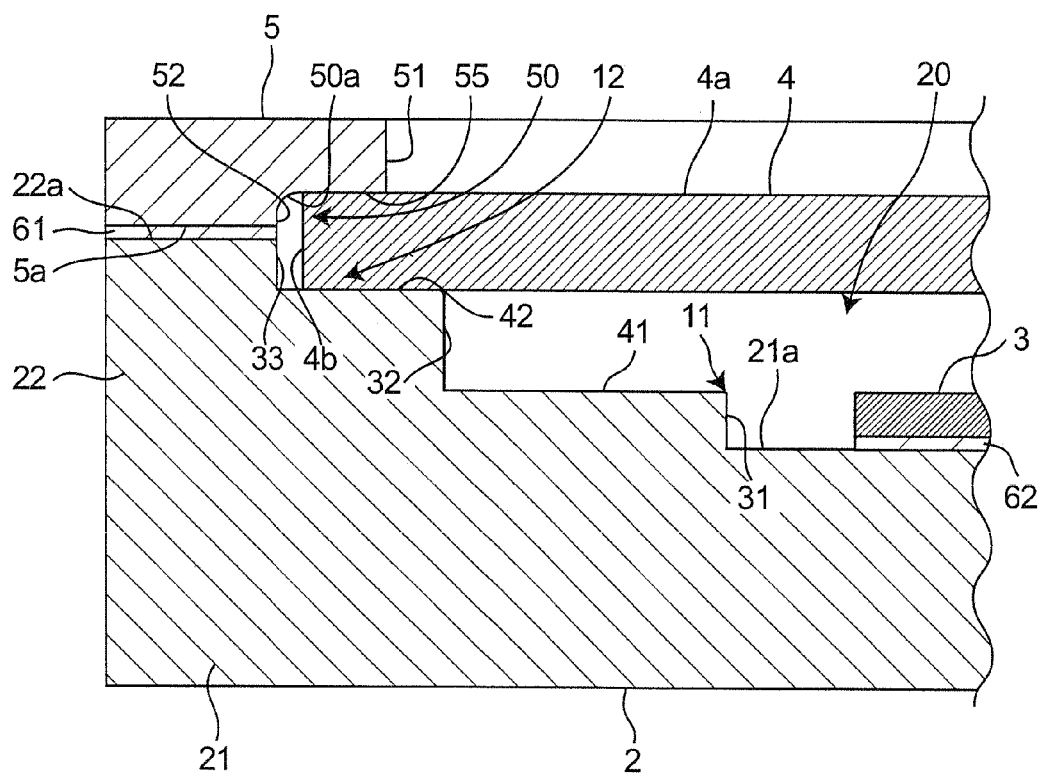
FIG. 4 is a schematic partially enlarged view of the light emitting device according to the embodiment of the present invention shown in FIG. 3.

FIG. 4 is a partial enlarged view of FIG. 3. As shown in FIG. 4, the inner surface of the side recess 50 of the frame member 5 has a curved surface 50a. The curved surface 50a according to the present embodiment is positioned at the connecting portion between the stepped surface 55 and the second inner surface 52 of the frame member 5. In this manner, when the inner surface of the side recess 50 of the frame member 5 has the curved surface 50a, it becomes possible to bring the corner portion of the light-transmissive member 4 into contact with the curved surface 50a of the side recess 50. Accordingly, the light-transmissive member 4 can be securely fixed, and occurrence of a positional error or the like can be reliably prevented.

An outer circumferential surface 4b of the light-transmissive member 4 is spaced apart from the third inner surface 33 of the side recess 12 of the package 2 and the second inner surface 52 of the side recess 50 of the frame member 5. In this manner, since a clearance is provided between the outer circumferential surface 4b of the light-transmissive member 4 and the third inner surface 33 of the package 2, and a clearance is provided between the outer circumferential surface 4b of the light-transmissive member 4 and the second inner surface 52 of the frame member 5, an occurrence of cracking can be prevented even when the light-transmissive member 4, the package 2, and the frame member 5 are expanded in a lateral direction.

Note that, the height of the frame member 5 and presence/absence of the side recess 50 can be determined by the height relationship between the upper surface 4a of the light-transmissive member 4 disposed in the package 2 and the upper surface 22a of the package 2. For example, as in the present embodiment, in the case where the light-transmissive member 4 is disposed in the side recess 12 of the package 2, and the upper surface 4a of the light-transmissive member 4 is at the position higher than the upper surface 22a of the package 2, it is preferable to employ the frame member 5 having the side recess 50 whose height (the second inner surface 52) is higher than the height of the light-transmissive member 4 that projects further than the upper surface 22a of the package 2.

Figure 5A:
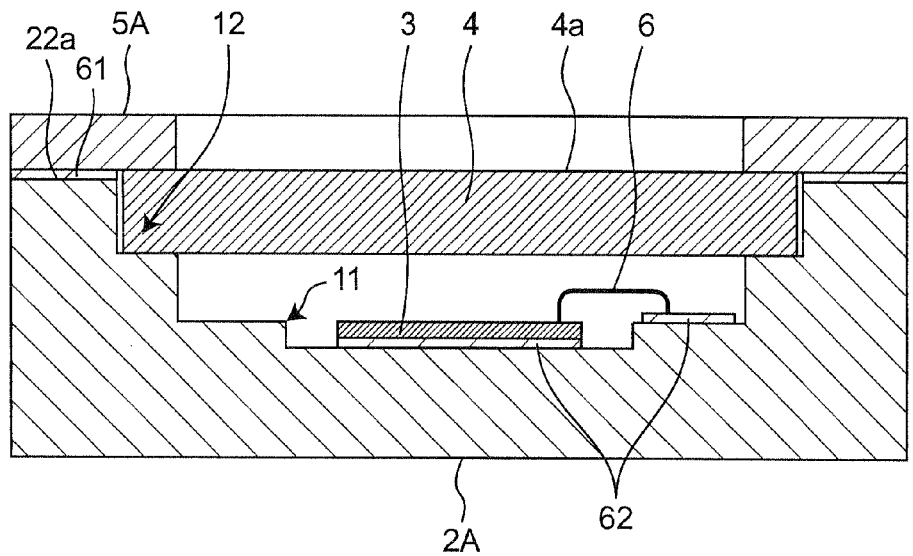
FIG. 5A is a cross-sectional view showing a light emitting device according to another embodiment of the present invention.

Further, as shown in FIG. 5A, in the case where the upper surface 4a of the light-transmissive member 4 and the upper surface 22a of a package 2A have substantially the same heights, the frame member 5A can be made in a shape which is not provided with a side recess (i.e., the frame member 5 does not have the stepped surface 55 so that each of the inner surfaces is made of a single surface). Specifically, the frame member 5A may have a plate-like shape.

Figure 5B:
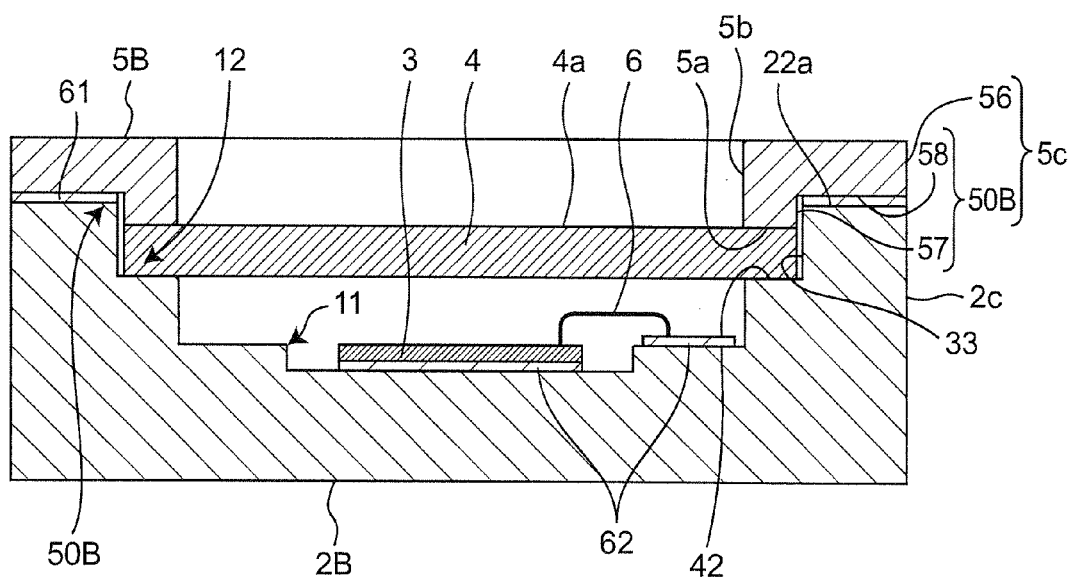
FIG. 5B is a cross-sectional view showing the light emitting device according to another embodiment of the present invention.

Still further, as shown in FIG. 5B, in the case where the upper surface 4a of the light-transmissive member 4 is positioned lower than the upper surface 22a of a package 2B, it is preferable to employ a frame member 5B with a groove 50B. The frame member 5B has at least a lower surface 5a and outer circumferential surfaces 5c. The outer circumferential surfaces 5c are formed outer than the outer edge of the lower surface 5a of the frame member 5B. In detail, the outer circumferential surface 5c of the frame member 5B has, in order from the bottom side to the top side, a second outer surface 57 substantially perpendicularly adjacent to the lower surface 5a of the frame member 5B, a stepped surface 58 outwardly substantially perpendicularly adjacent to the second outer surface 57 therefrom, and a first outer surface 56 adjacent to the stepped surface 58 substantially perpendicularly and substantially flush with an outer side surface 2c of the sidewall portion of the package 2B. The inner circumferential surface 5b of the frame member 5B is substantially flush. The stepped surface 58 and the second outer surface 57 define the groove 50B. By bonding the upper surface 22a of the package 2B and the stepped surface 58 of the frame member 5B, the light-transmissive member 4 is held by and between the lower surface 5a of the frame member 5B and the second stepped surface 42 of the package 2B. By employing such a structure, the area where the package 2B and the frame member 5B are brought into contact with each other can be increased in addition to the bonding portion (i.e., the third inner surface 33 of the package 2B and the second outer surface 57 of the frame member 5B can be brought into contact with each other). Accordingly, the package 2B and the frame member 5B can be more reliably fixed to each other.

In the present embodiment, two or more side recesses 50 may be provided in the frame member 5. Further, the side recess 50 is not necessarily formed along the entire circumference of the inner circumferential surface 5b (or the outer circumferential surface 5c) of the frame member 5, and can be formed as appropriate, such as just at the opposite sides or at the corner portions. In this case, the side recess 50 may have a first side recess portion and a second side recess portion which are formed at respective opposite sides of the frame member. By adjusting the range of the frame member 5 positioned over the upper surface 4a of the light-transmissive member 4 (e.g., the size of the space inner than the inner circumferential surface 5b of the frame member 5) as appropriate, the light emitting device 1 having the light emitting surface of the desired size can be formed.

(Wire 6)

The wire 6 is provided for electrically connecting the light emitting element 3 and the interconnection 62 of the package 2 to each other. For example, a metal such as gold, copper, silver, platinum, aluminum, or alloy thereof can be used as a material for the wire 6. In particular, gold is preferable because it is less likely to break and shows excellent heat resistance or the like.

(Protective Element 7)

The protective element 7 may be a Zener Diode, a capacitor or the like, that can be mounted in the package 2 for preventing the light emitting element 3 from being damaged by overvoltage. In the present embodiment, the protective element 7 is disposed on the interconnection on the upper surface 21a of the bottom surface portion 21.

Next, a description will be given of a method for producing the light emitting device 1.

Figure 6A:
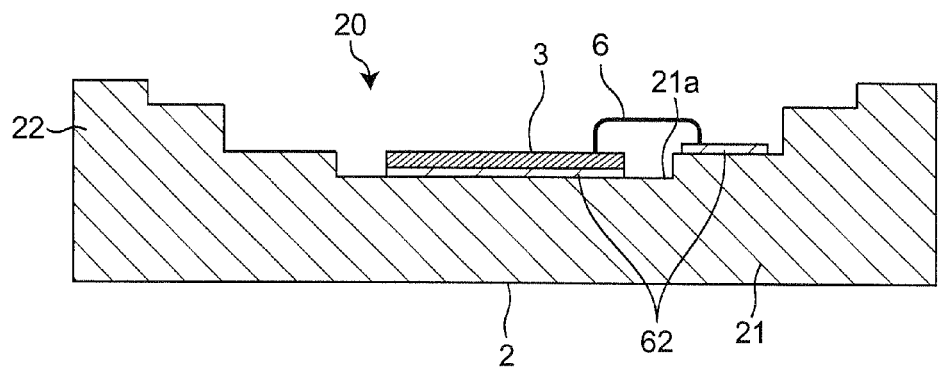
FIG. 6A is a schematic cross-sectional view showing a method of producing the light emitting device according to an embodiment of the present invention.

As shown in FIG. 6A, the light emitting element 3 is disposed in the recess 20 of the package 2 (more specifically, on the interconnection 62 of the upper surface 21a of the bottom surface portion 21) via an adhesive agent or the like. Then, the light emitting element 3 and the interconnection 62 of the package 2 are electrically connected to each other by the wire 6. In the same manner, the protective element 7 is appropriately disposed in the recess 20 of the package 2.

Figure 6B:
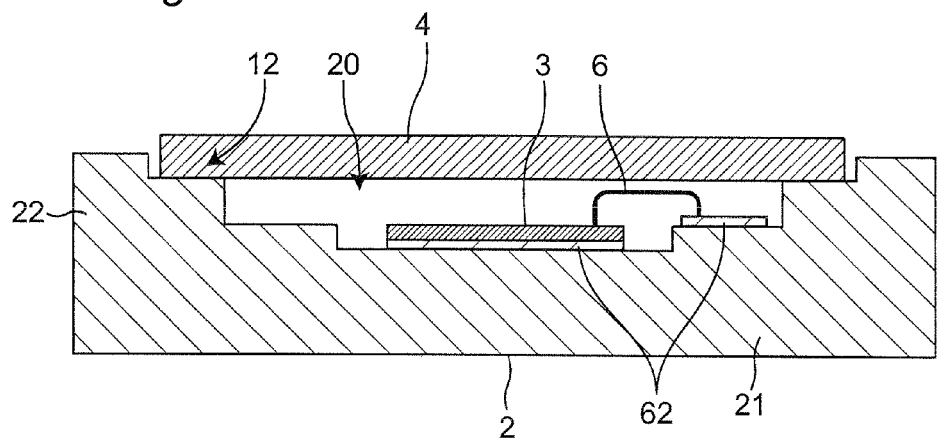
FIG. 6B is a schematic cross-sectional view showing the method of producing the light emitting device according to the embodiment of the present invention.

Thereafter, as shown in FIG. 6B, the light-transmissive member 4 with a height higher than the upper surface of the package 2 is disposed in the side recess 12 of the package 2. Then, the opening of the recess 20 of the package 2 is covered with the light-transmissive member 4.

Figure 6C:
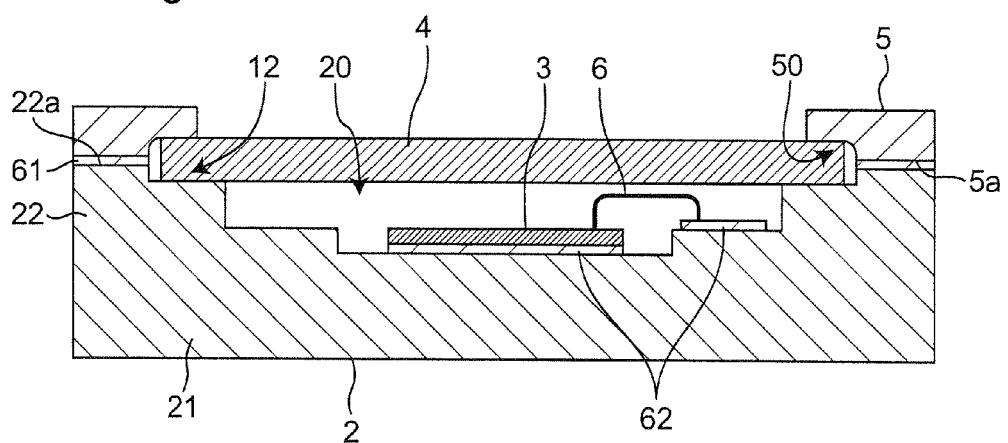
FIG. 6C is a schematic cross-sectional view showing the method of producing the light emitting device according to the embodiment of the present invention.

As shown in FIG. 6C, a solder material such as Au—Sn serving as the adhesive agent 61 is prepared on the upper surface 22a of the package 2, then, the frame member 5 is disposed such that the lower surface 5a thereof faces the upper surface 22a of the package 2. At this time, since the light-transmissive member 4 is fixed by the side recess 12 of the package 2, the frame member 5 can be easily disposed. Then, Au—Sn is melted through use of a reflow oven, an oven, a heater or the like. By achieving eutectic bonding between the upper surface 22a of the package 2 and the lower surface 5a of the frame member 5, the light-transmissive member 4 is fitted into the side recess 12 of the package 2 and the side recess 50 of the frame member 5.

In the light emitting device 1 according to the present embodiment, the light-transmissive member 4 is held by and between the package 2 and the frame member 5 bonded to the package 2. Thus, the light-transmissive member 4 can be reliably held. Further, since the light-transmissive member 4 is simply held by and between the package 2 and the frame member 5, occurrence of a crack in the light-transmissive member 4 due to a difference in the coefficient of thermal expansion between the light transmissive member 4 and the package 2 and/or the frame member 5 can be prevented. Further, since coefficients of linear expansion of the light-transmissive member 4 can be freely selected, quartz or sapphire, or glass such as borosilicate glass each exhibiting excellent light transmittance can be employed as the light-transmissive member 4.

Here, assuming that the light-transmissive member 4 is held by a soft material such as gel softer than the package 2 in place of the package 2 and the frame member 5, the light-transmissive member 4 cannot be retained stably.

In the light emitting device 1 according to the present embodiment, the frame member 5 is a member separate from the package 2 and made of a different material. Accordingly, when the package 2 is made of ceramic, the frame member 5 can be made of a material other than ceramic. By employing such a structure, materials being reasonable in costs and functions can be selected.

In connection with the light emitting device 1 according to the present embodiment, the package 2 has the side recess 12 for the light-transmissive member 4 to be fitted into, and the frame member 5 has the side recess 50 for the light-transmissive member 4 to be fitted into. Accordingly, positional error of the light-transmissive member 4 can be reliably prevented. In particular, since the package 2 has the side recess 12, during producing, the frame member 5 can be placed over the package 2 in the state where the light-transmissive member 4 is fixed by the side recess 12. Thus, assemblability is improved.

According to the method for producing the light emitting device 1 of the present embodiment, the opening of the recess 20 of the package 2 is covered with the light-transmissive member 4, and thereafter the frame member 5 is bonded to the package 2, such that the light-transmissive member 4 is held by the frame member 5 and the package 2 therebetween. Therefore, the light-transmissive member 4 can be held reliably and easily. Further, since the light-transmissive member 4 is just held by the package 2 and the frame member 5 therebetween, the light-transmissive member 4 can be prevented from being cracked by a difference from the package 2 or the frame member 5 in thermal expansion coefficient.

Note that, the present invention is not limited by the embodiment described above, and the design thereof can be modified within the range not departing from the gist of the present invention.

In the present embodiment, though the side recesses are provided to the package and the frame member respectively for the light-transmissive member to be fitted into, a side recess may be provided to at least one of either the package or the frame member. Accordingly, positional errort of the light-transmissive member can be prevented.

In the present embodiment, though the package is formed by the bottom surface portion and the sidewall portion which are integrally formed, the package may be made of the bottom surface portion and the sidewall portion which are separately formed.

In the present embodiment, though the curved surface is provided to the inner surface of the side recess of the frame member, a planar surface may be provided in place of the curved surface.

Figure 7:
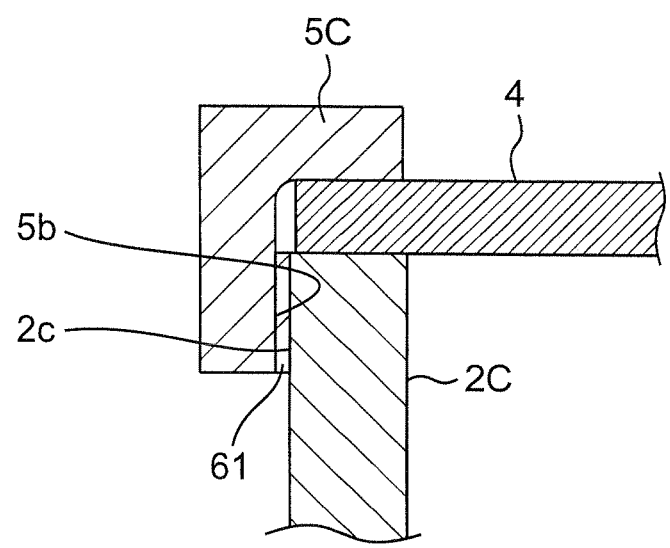
FIG. 7 is an enlarged cross-sectional view of a light emitting device according to still another embodiment of the present invention.

In the present embodiment, the lower surface of the frame member is bonded to the upper surface of the package. However, for example as shown in FIG. 7, part of the inner circumferential surface 5b of a frame member 5C may be bonded to the outer side surface 2c of a package 2C. So long as the light-transmissive member 4 is held by the package 2C and the frame member 5C therebetween, the package 2C and the frame member 5C may be bonded to each other at any portion.

In the present embodiment, the recess 20 of the package 2 covered with the light-transmissive member 4 is hollow. However, the recess 20 may be filled by any light transmitting material as appropriate (e.g., resin, glass or the like). Further, as desired, phosphor, coloring agent, a light diffusing agent, filler or the like may be contained in such a light transmitting material.

It is to be understood that although the present invention has been described with regard to preferred embodiments thereof, various other embodiments and variants may occur to those skilled in the art, which are within the scope and spirit of the invention, and such other embodiments and variants are intended to be covered by the following claims.

What is claimed is:

1. A light emitting device comprising:
    a package having a recess;
    a light emitting element disposed in the recess;
    a light-transmissive member covering an opening of the recess; and
    a frame member bonded to the package,
    wherein the light-transmissive member is held by and between the package and the frame member,
    wherein at least the package, among the package and the frame member, has a side recess for arranging the light-transmissive member,
    wherein a lower surface of the frame member and an upper surface of the package are bonded to each other, and
    wherein the recess is structured by a bottom surface portion and a sidewall portion, the sidewall portion comprising an inner circumferential surface, the inner circumferential surface comprising, in order from a bottom side to a top side, a first inner surface adjacent to an upper surface of the bottom surface portion, a first stepped surface adjacent to the first inner surface outwardly, a second inner surface adjacent to the first stepped surface, a second stepped surface adjacent to the second inner surface outwardly, and a third inner surface adjacent to the second stepped surface and adjacent to the upper surface of the sidewall portion, and the second stepped surface and the third inner surface form the side recess of the package.

2. The light emitting device according to claim 1, wherein the package and the frame member are bonded by a solder which is an adhesive agent.

3. The light emitting device according to claim 1, wherein the frame member has a side recess for arranging the light-transmissive member, and wherein the side recess of the frame member has a first side recess portion and a second side recess portion, the first side recess portion being formed at one side of the frame member, the second side recess portion being formed at another side opposite to the one side of the frame member.

4. The light emitting device according to claim 2, wherein the frame member has a side recess for arranging the light-transmissive member, and wherein the side recess of the frame member has a first side recess portion and a second side recess portion, the first side recess portion being formed at one side of the frame member, the second side recess portion being formed at another side opposite to the one side of the frame member.

5. The light emitting device according claim 2, wherein the frame member has a side recess for arranging the light-transmissive member, and an inner surface of the frame member defines the side recess, wherein the inner surface of the frame member has a curved surface.

6. The light emitting device according claim 4, wherein an inner surface of the frame member defines the side recess, wherein the inner surface of the frame member has a curved surface.

7. The light emitting device according to claim 1, wherein the frame member is made of a material different from a material of the package.

8. The light emitting device according to claim 6, wherein the frame member is made of a material different from a material of the package.

9. The light emitting device according to claim 1, wherein the package is made of ceramic.

10. The light emitting device according to claim 8, wherein the package is made of ceramic.

11. The light emitting device according to claim 1, wherein the frame member is made of a metal.

12. The light emitting device according to claim 10, wherein the frame member is made of a metal.

13. The light emitting device according to claim 1, wherein the package further has
    a step difference under the side recess,
    a positive and a negative interconnection are disposed on an upper surface of the step difference, and
    the light emitting element and the positive and negative interconnections are electrically connected by wires respectively.

14. The light emitting device according to claim 12, wherein the package further has
    a step difference under the side recess,
    a positive and a negative interconnection are disposed on an upper surface of the step difference, and
    the light emitting element and the positive and negative interconnections are electrically connected by wires respectively.

15. A method of producing a light emitting device comprising steps of:
    disposing a light emitting element in a recess of a package;
    covering an opening of the recess with a light-transmissive member; and
    bonding a lower surface of a frame member to an upper surface of the package by a solder to hold the light-transmissive member by and between the package and the frame member,
    wherein the light-transmissive member is held by a side recess formed at least in the package among the package and the frame member, and
    wherein the recess is structured by a bottom surface portion and a sidewall portion, the sidewall portion comprising an inner circumferential surface, the inner circumferential surface comprising, in order from a bottom side to a top side, a first inner surface adjacent to an upper surface of the bottom surface portion, a first stepped surface adjacent to the first inner surface outwardly, a second inner surface adjacent to the first stepped surface, a second stepped surface adjacent to the second inner surface outwardly, and a third inner surface adjacent to the second stepped surface and adjacent to the upper surface of the sidewall portion, and the second stepped surface and the third inner surface form the side recess of the package.

16. The light emitting device according claim 1, wherein the package has the side recess at a place inner than the upper surface of the package in a plan view, and the frame member has a side recess at a place inner than the lower surface of the frame member in a plan view.

17. The method of producing a light emitting device according to claim 15, wherein the package has the side recess at a place inner than the upper surface of the package in a plan view, and the frame member has a side recess at a place inner than the lower surface of the frame member in a plan view.

* * * * *